(12) United States Patent
Wan et al.

(10) Patent No.: US 11,508,727 B2
(45) Date of Patent: Nov. 22, 2022

(54) INSULATED GATE BIPOLAR TRANSISTOR MODULE, CONDUCTOR INSTALLING STRUCTURE THEREFOR, AND INVERTER

(71) Applicant: SUNGROW POWER SUPPLY CO., LTD., Anhui (CN)

(72) Inventors: Rubin Wan, Anhui (CN); Qiyao Zhu, Anhui (CN); Jigui Feng, Anhui (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 317 days.

(21) Appl. No.: 16/773,166

(22) Filed: Jan. 27, 2020

(65) Prior Publication Data
US 2020/0312850 A1    Oct. 1, 2020

(30) Foreign Application Priority Data
Mar. 25, 2019   (CN) .......................... 201920385893.4

(51) Int. Cl.
*H01L 27/10*       (2006.01)
*H01L 27/102*    (2006.01)
(Continued)

(52) U.S. Cl.
CPC .......... *H01L 27/1022* (2013.01); *H01L 24/05* (2013.01); *H02M 7/537* (2013.01);
(Continued)

(58) Field of Classification Search
CPC ................. H01L 27/1022; H01L 24/05; H01L 2224/05553; H01L 23/04; H02M 7/537; H05K 1/111; H05K 2201/09663
See application file for complete search history.

(56) References Cited

U.S. PATENT DOCUMENTS 5,563,447 A * 10/1996 Lake ...................... H01L 25/18
                                                                257/730
2011/0136362 A1* 6/2011 O'Leary ................ H02G 5/007
                                                                174/88 B
(Continued)

FOREIGN PATENT DOCUMENTS

CN          207409474 U       5/2018

OTHER PUBLICATIONS

EPO Extended Search Report for corresponding EP Application Patent No. 20155032.4 dated Jul. 3, 2020.

*Primary Examiner* — S M Sohel Imtiaz
(74) *Attorney, Agent, or Firm* — Cantor Colburn LLP

(57) ABSTRACT

An IGBT module, a conductor installing structure for the IGBT module and an inverter are provided. The conductor installing structure for the IGBT module includes a substrate, a conductor and an insulation sleeve sleeved on the conductor and insulatedly isolating the conductor from the substrate. In the conductor installing structure for the IGBT module according to the present disclosure, by using the insulation sleeve sleeved on the conductor to insulatedly isolating the conductor from the substrate, the comparative tracking index of the IGBT module is improved, thereby improving the creepage distance of the IGBT module. In addition, compared with conventional technologies of spraying insulation varnish or insulation paste, the insulating property of the insulation sleeve can be better detected and guaranteed, and the bounding between the insulation sleeve and the substrate can be better enhanced, improving the insulation reliability.

10 Claims, 6 Drawing Sheets

(51) Int. Cl.
  *H02M 7/537* (2006.01)
  *H01L 23/00* (2006.01)
  *H05K 1/11* (2006.01)

(52) U.S. Cl.
  CPC .... *H05K 1/111* (2013.01); *H01L 2224/05553* (2013.01); *H05K 2201/09663* (2013.01)

(56) References Cited

U.S. PATENT DOCUMENTS

| | | | |
|---|---|---|---|
| 2013/0257201 A1* | 10/2013 | Lemke | H02K 5/225 |
| | | | 310/71 |
| 2014/0361424 A1* | 12/2014 | Horio | H05K 7/209 |
| | | | 257/704 |
| 2018/0043910 A1 | 2/2018 | Schneider et al. | |
| 2018/0124935 A1* | 5/2018 | Nakatsu | H05K 7/20 |
| 2018/0261944 A1* | 9/2018 | Papageorge | H01R 13/5825 |
| 2020/0144140 A1* | 5/2020 | Trüssel | H01L 23/29 |

\* cited by examiner

INSULATED GATE BIPOLAR TRANSISTOR MODULE, CONDUCTOR INSTALLING STRUCTURE THEREFOR, AND INVERTER

CROSS REFERENCE TO RELATED APPLICATIONS

The present invention claims priority under 35 U.S.C. § 119 to Chinese Patent Application No. 201920385893.4, filed on Mar. 25, 2019, the entire content of which is incorporated herein by reference.

FIELD

The present disclosure relates to the field of photovoltaic grid-connection technology, particularly to an insulated gate bipolar transistor (IGBT) module, a conductor installing structure for the IGBT module, and an inverter.

BACKGROUND

In a grid-connection photovoltaic generation system, an inverter is used as an interface device between the photovoltaic generation system and a power grid. In application, the inverter should meet requirements of safety regulations. When the photovoltaic generation system has a high voltage, an IGBT module of the inverter can hardly meet the requirements of safety regulations. Specifically, creepage distance of the IGBT module can hardly meet the requirement of safety regulations.

At present, insulation varnish or insulation paste is sprayed on the surface of the IGBT module to insulate and isolate a conductor from a substrate, so as to improve the comparative tracking index of the IGBT module, thereby improving the creepage distance of the IGBT module to meet the requirement.

However, the uniformity of the spaying process is difficult to control, and thus the effectiveness of spraying is hard to determine. In addition, an adhesion of the insulation varnish or the insulation paste to the substrate is insufficient, which may easily result in a crack. Therefore, it is hard to determine whether the sprayed IGBT module meets the requirements of safety regulations, having a risk of insulation failure, which may cause a failure of the inverter and a low reliability.

Therefore, it is desired to solve the problem of how to increase the creepage distance of the IGBT module while improving the reliability of the IGBT module.

SUMMARY

In view of above, a conductor installing structure for an IGBT module is provided according to the present disclosure to increase the creepage distance of the IGBT module and improve insulation reliability. In addition, an IGBT module with the conductor installing structure and an inverter with the IGBT module are also provided.

The conductor installing structure for an IGBT module includes a substrate, a conductor and an insulation sleeve sleeved on the conductor and insulatedly isolating the conductor from the substrate.

In an embodiment, the insulation sleeve is fixed on the substrate.

In an embodiment, the insulation sleeve includes: an insulation bushing sleeved on the conductor, and an insulation plate fixed with the circumferential side wall of the insulation bushing. The insulation plate is arranged on an installing surface of the substrate where the conductor is located.

In an embodiment, the insulation plate, on one side closing to the edge of the substrate, has an outer extension, and the outer extension protrudes out of the outside edge of the installing surface of the substrate where the conductor is located.

In an embodiment, at least one of the insulation plate and the insulation bushing is fixed on the substrate.

In an embodiment, in a case that the insulation plate is fixed on the substrate, the insulation plate is fixed on the substrate by a snap engagement.

In an embodiment, the insulation plate is arranged with a step structure having a snap engagement with the substrate.

In an embodiment, in a case that the insulation bushing is fixed on the substrate, the insulation bushing is inserted in a groove of the substrate.

In an embodiment, the top of the insulation plate is arranged with a supporting projection for supporting a circuit board of the IGBT module.

In an embodiment, a cross section of the insulation bushing (31) is square, rectangular or circular.

In the conductor installing structure for the IGBT module according to the present disclosure, by using the insulation sleeve sleeved on the conductor to insulatedly isolate the conductor from the substrate, the comparative tracking index of the IGBT module is improved, thereby improving the creepage distance of the IGBT module. In addition, compared with conventional technologies of spraying insulation varnish or insulation paste, the insulating property of the insulation sleeve can be better detected and guaranteed, and the bonding between the insulation sleeve and the substrate can be better enhanced, improving the insulation reliability.

Further, an IGBT module including any of the above conductor installing structures is further provided.

Further, an inverter including the above IGBT module is provided.

BRIEF DESCRIPTION OF THE DRAWINGS

For clearer illustration of the technical solutions according to embodiments of the present disclosure or conventional techniques, hereinafter are briefly described the drawings to be used in description of embodiments of the present disclosure or conventional techniques. Apparently, the drawings in the following descriptions only show some embodiments of the present disclosure, and other drawings may be obtained by those skilled in the art based on the provided drawings without creative efforts.

DETAILED DESCRIPTION

Figure 1:
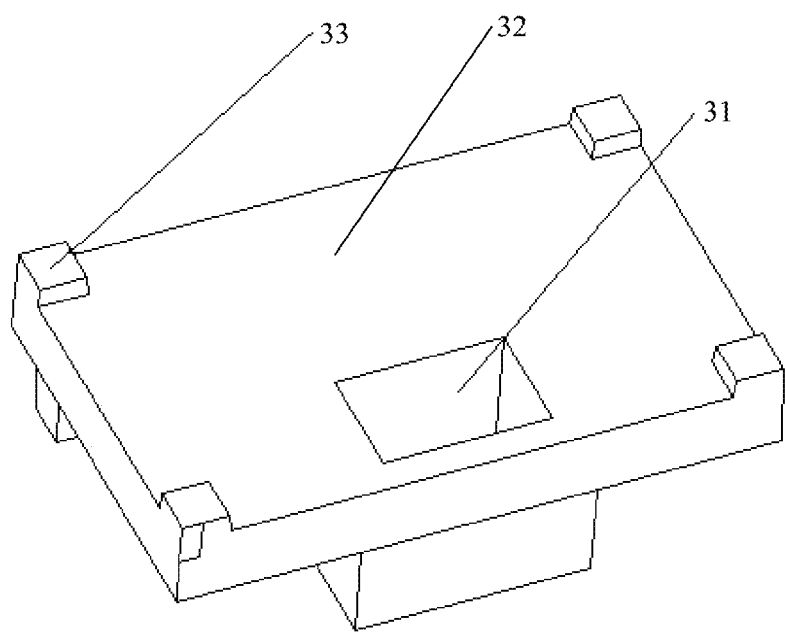
FIG. 1 is a schematic structural diagram of an insulation sleeve in a conductor installing structure for an IGBT module according to an embodiment of the present disclosure.
Figure 2:
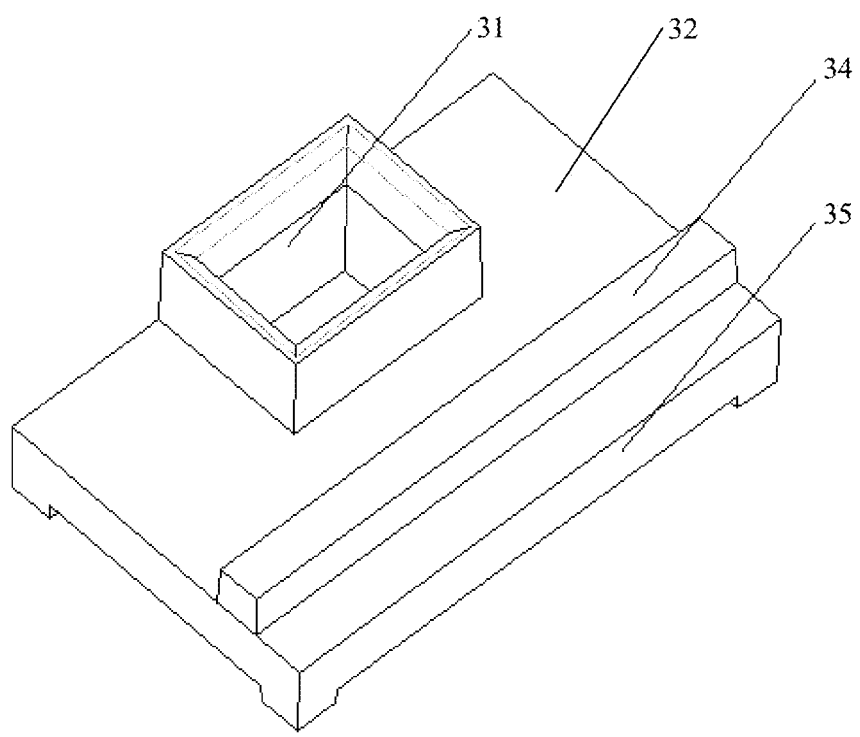
FIG. 2 is a schematic structural diagram of the insulation sleeve according to FIG. 1, viewed from another direction.
Figure 3:
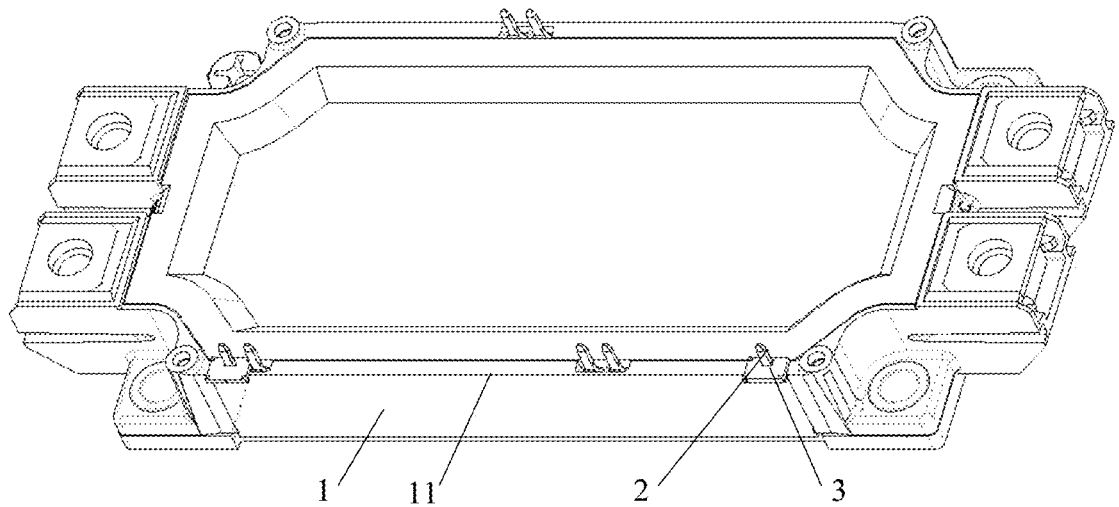
FIG. 3 is a schematic structural diagram of a conductor installing structure for an IGBT module according to an embodiment of the present disclosure.
Figure 4:
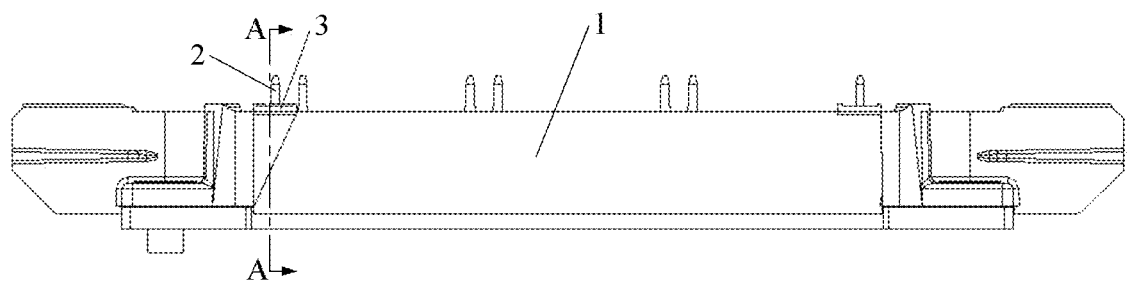
FIG. 4 is a front view of a conductor installing structure for an IGBT module according to an embodiment of the present disclosure.
Figure 5:
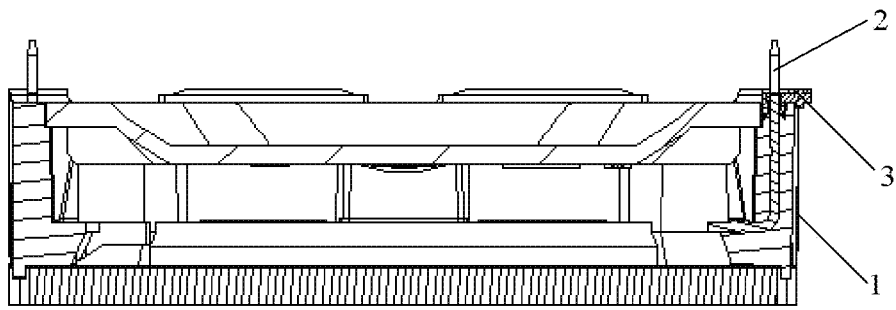
FIG. 5 is a cross-sectional view of the structure in FIG. 4 along the line A-A.

Technical solutions of embodiments of the present disclosure are clearly and completely described below in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative effort fall within the protection scope of the present disclosure.

As shown in FIG. 1 to FIG. 9, a conductor installing structure for an IGBT module according to an embodiment of the present disclosure includes a substrate 1, a conductor 2 and an insulation sleeve 3 sleeved on the conductor 2 and insulatedly isolating the conductor 2 from the substrate 1.

In the conductor installing structure for the IGBT module according to the present disclosure, by using the insulation sleeve 3 sleeved on the conductor 2 to insulatedly isolate the conductor 2 from the substrate 1, the comparative tracking index of the IGBT module is improved, thereby improving the creepage distance of the IGBT module. In addition, compared with conventional technologies of spraying insulation varnish or insulation paste, the insulating property of the insulation sleeve 3 can be better detected and guaranteed, and the bonding between the insulation sleeve 3 and the substrate 1 can be better enhanced, improving the insulation reliability.

In order to facilitate installation of the insulation sleeve 3 and improve the insulation reliability, the insulation sleeve 3 includes: an insulation bushing 31 sleeved on the conductor 2, and an insulation plate 32 fixeded with the circumferential side wall of the insulation bushing 31. The insulation plate 32 is arranged on an installing surface of the substrate 1 where the conductor 2 is located.

In the above insulation sleeve 3, the insulation plate 32 and the insulation bushing 31 may have or not have a one-to-one correspondence. In particular, there may be one insulation bushing 31 or at least two insulation bushings 31 arranged in the insulation plate 32.

Alternatively, the insulation sleeve 3 may only include the insulation bushing 31 without the insulation plate 32, which is not limited to the above embodiments.

Further, the insulation plate 32, on one side closing to the edge of the substrate 1, has an outer extension 35, and the outer extension 35 protrudes out of the outside edge 11 of the installing surface of the substrate 1 where the conductor 2 is located. It is understood that, the outside edge 11 refers to the side of the installing surface that is close to the edge of the substrate 1, that is, the outside edge 11 refers to the side of the installing surface that is far away from the center of the substrate 1.

By the outer extension 35 of the insulation sleeve 3, the creepage safety regulation distance of the entire IGBT module is increased, thereby further improving the safety of the IGBT module.

In practices, safety regulation requirements on distances for different voltage levels can be met by adjusting the size of the outer extension 35, which improves universality. In particular, the length by which the outer extension 35 protrudes out of the outside edge 11 is determined according to the distance required in safety regulations, which is not limited herein.

In the insulation sleeve 3, the outer extension 35 and the insulation plate 32 may be implemented in a one-piece structure or may be implemented as two separate parts insulatedly connected with each other.

Figure 6:
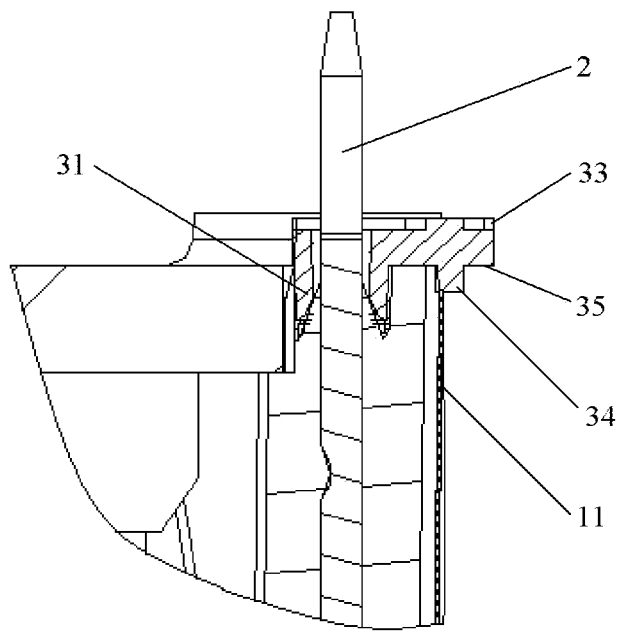
FIG. 6 is a partial enlarged diagram of the structure in FIG. 5.
Figure 7:
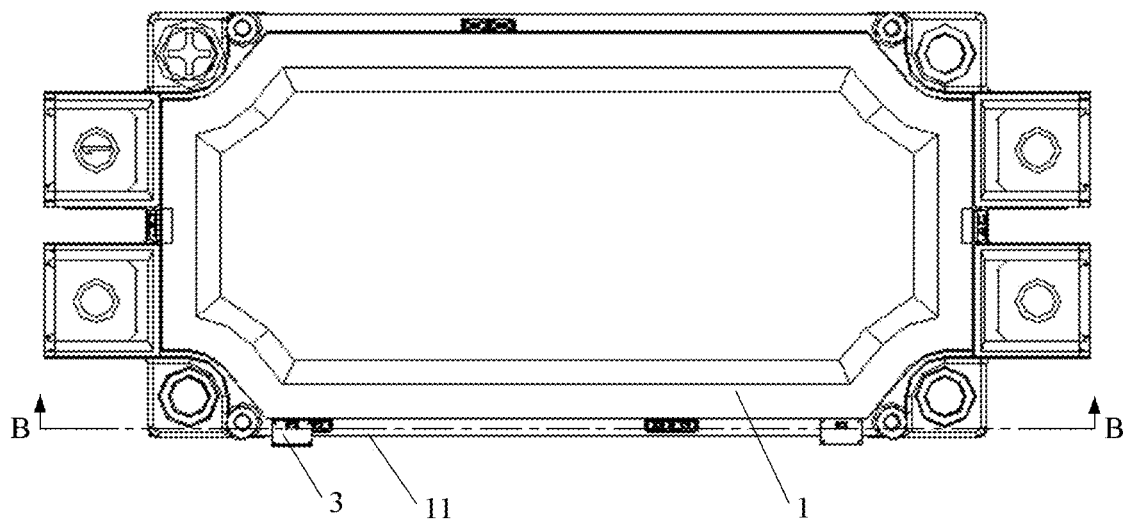
FIG. 7 is a top view of a conductor installing structure for an IGBT module according to an embodiment of the present disclosure.
Figure 8:
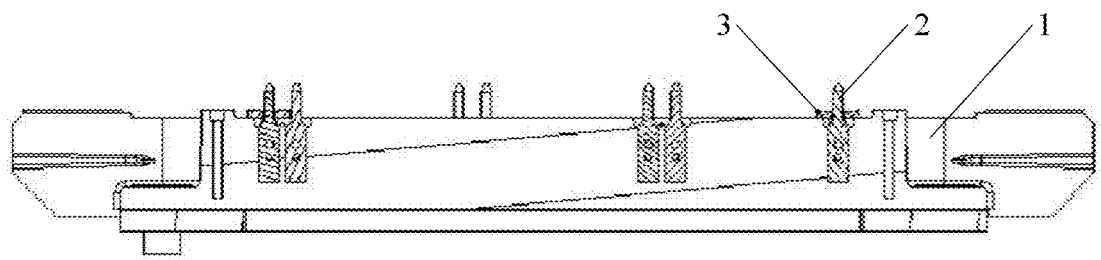
FIG. 8 is a cross-sectional view of the structure in FIG. 7 along the line B-B.
Figure 9:
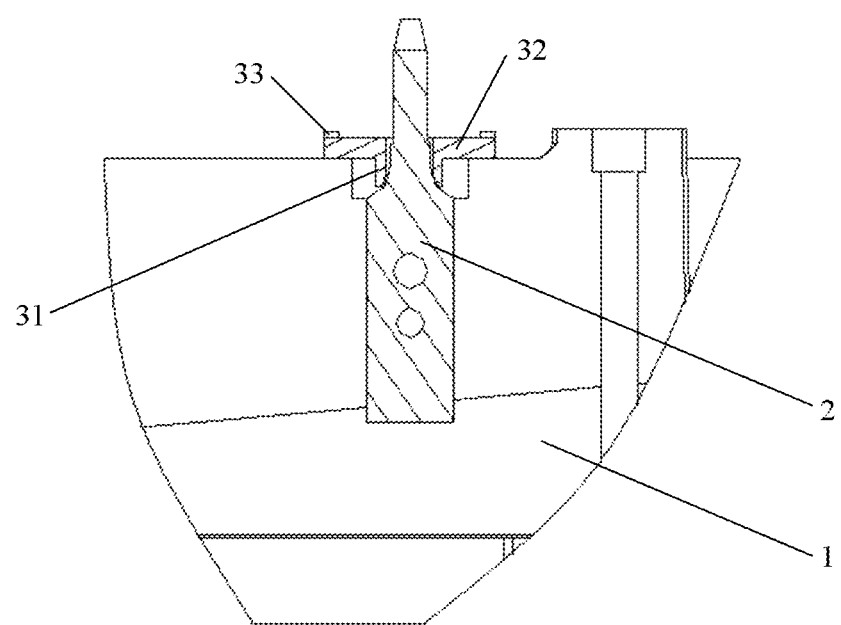
FIG. 9 is a partial enlarged diagram of the structure in FIG. 8.

In order to reduce the volume of the insulation plate 32, the inside edge of the insulation plate 32 that is close to the center of the substrate 1 is level with the insulation bushing 31, as shown in FIG. 6.

A side of the insulation bushing 31 that is away from the edge of the substrate 1, i.e., a side of the insulation bushing 31 that is close to the center of the substrate 1, may be arranged with an opening or not, which is determined according to actual requirements and is not limited herein.

It is understood that, in a case that the insulation plate 32 has the outer extension 35, the opening and the outer extension 35 are respectively arranged in two sides of an axis of the insulation bushing 31.

The size and shape of the opening may be determined according to actual requirements, which is not limited herein.

In order to facilitate installation, the lower part of the inner bore of the insulation bushing 31 is formed to be gradually wider from the top of the substrate 1 to the bottom of the substrate 1, as shown in FIG. 6. Apparently, the inner bore of the insulation bushing 31 may be in other shapes, which is not limited herein.

The insulation sleeve 3 is fixed to the IGBT module to ensure reliability. In order to facilitate the fixing, the insulation sleeve 3 is preferably fixed on the substrate 1. In a case that the insulation sleeve 3 includes the insulation plate 32, the insulation plate 32 is preferably fixed on the substrate 1, that is, the whole insulation sleeve 3 is fixed on the substrate 1 by fixing the insulation plate 32 on the substrate 1.

The manner of fixing the insulation plate 32 may be determined according to actual requirements. For example, the insulation plate 32 may be fixed by a snap engagement, an adhering connection, and the like. In order to facilitate installation, the snap engagement is preferably used to fix the insulation plate 32 on the substrate 1. Further, the insulation plate 32 may be arranged with a step structure 34 to have a snap engagement with the substrate 1, in order to achieve a simple and convenient installation. Apparently, the snap engagement between the insulation plate 32 and the substrate 1 may be achieved by other snap engagement structures, such as a snapping hook, a snapping groove, and the like, which is not limited herein.

The insulation sleeve 3 may be fixed on the substrate 1 by the insulation bushing 31. That is, the whole insulation sleeve 3 is fixed on the substrate 1 by fixing the insulation bushing 31 on the substrate 1. In an embodiment, the insulation sleeve 3 is inserted in a groove of the substrate 1. Therefore, an existing groove in the substrate 1 is utilized, which simplifies the structure and facilitates the fixing. Apparently, the insulation bushing 31 may be fixed to the substrate 1 in other manners, which is not limited herein.

In a case that the insulation bushing 31 is fixed on the substrate 1, the bottom of the insulation bushing 31 extends out from the bottom of the insulation plate 32. The top of the insulation bushing 31 may be level with the insulation plate 32 or extend out from the top of the insulation plate 32.

In an embodiment, in order to enhance stability and reliability, the insulation plate 32 and the insulation bushing 31 are preferably both fixed on the substrate 1.

In order to install a circuit board of the IGBT module, the top of the insulation plate 32 is arranged with a supporting projection 33 for supporting the circuit board of the IGBT module.

The number and shape of the supporting projection 33 are determined according to actual requirements. For example, when the insulation plate 32 is square, there are preferably four supporting projections 33, and the four supporting projection are located in the vertex angles of the insulation plate 32, which is not limited herein.

With the above structure, the circuit board is supported by the supporting projection 33, and also the circuit board compresses the insulation plate 32, which improves the fixing reliability.

The shapes of the insulation bushing 31 and the insulation plate 32 are determined according to actual requirements. For example, a cross section of the insulation bushing 31 may be square, rectangular, circular, elliptic and the like, and the insulation plate 32 may be square, rectangular, circular, and the like.

In order to simplify the installation, the insulation bushing 31 and the insulation plate 32 may be in a one-piece structure. Apparently, the insulation bushing 31 and the insulation plate 32 may alternatively be two separate parts fixed with each other by a connection element or a connection structure.

In the conductor installing structure for the IGBT module, the conductor 2 may be a PIN needle or other conductive elements, which is not limited herein.

It is understood that the above PIN needle is a metal element in a connector, which is used to conduct electricity or transmit signals.

Based on the conductor installing structure for an IGBT module provided in the above embodiments, an IGBT module is further provided in the present disclosure. The IGBT module includes the conductor installing structure described in the above embodiments.

Since the conductor installing structure of an IGBT module has the above technical effects and the IGBT module includes the conductor installing structure, the IGBT module also has the same technical effects, which is not repeated herein.

The type of the IGBT module may be determined according to actual requirements, which is not limited herein.

Based on the IGBT module provided in the above embodiments, an inverter is further provided in the present disclosure. The inverter includes the IGBT module described in the above embodiments.

Since the IGBT module has the above technical effects and the inverter includes the IGBT module, the inverter also has the same technical effects, which is not repeated herein.

The type and application of the inverter may be determined according to actual requirements, which is not limited herein.

With the description of the embodiments disclosed above, those skilled in the art may implement or use technical solutions of the present disclosure. Numerous modifications to the embodiments are apparent to those skilled in the art, and the general principles defined herein may be implemented in other embodiments without departing from the spirit or scope of the present disclosure. Therefore, the present disclosure may not be limited to the embodiments described herein, but should comply with the widest scope consistent with the principles and novel features disclosed herein.

The invention claimed is:

1. A conductor installing structure for an insulated gate bipolar transistor (IGBT) module, comprising:
   a substrate,
   a conductor, and
   an insulation sleeve sleeved on the conductor and insulatedly isolating the conductor from the substrate,
   wherein the insulation sleeve comprises: an insulation bushing sleeved on the conductor, and an insulation plate fixed with the circumferential side wall of the insulation bushing, wherein the insulation plate is arranged on an installing surface of the substrate where the conductor is located; and
   wherein the insulation plate, on one side close to an edge of the substrate, has an outer extension, and the outer extension protrudes out of an outside edge of the installing surface of the substrate where the conductor is located.

2. The conductor installing structure according to claim 1, wherein the insulation sleeve is fixed on the substrate.

3. The conductor installing structure according to claim 1, wherein at least one of the insulation plate and the insulation bushing is fixed on the substrate.

4. The conductor installing structure according to claim 3, wherein in a case that the insulation plate is fixed on the substrate, the insulation plate is fixed on the substrate by a snap engagement.

5. The conductor installing structure according to claim 4, wherein the insulation plate is arranged with a step structure having a snap engagement with the substrate.

6. The conductor installing structure according to claim 3, wherein in a case that the insulation bushing is fixed on the substrate, the insulation bushing is inserted in a groove of the substrate.

7. The conductor installing structure according to claim 1, wherein the top of the insulation plate is arranged with a supporting projection for supporting a circuit board of the IGBT module.

8. The conductor installing structure according to claim 1, wherein a cross section of the insulation bushing is square, rectangular or circular.

9. An insulated gate bipolar transistor (IGBT) module, comprising the conductor installing structure according to claim 1.

10. An inverter, comprising the IGBT module according to claim 9.

* * * * *